(12) United States Patent
Sharma et al.

(10) Patent No.: US 11,043,497 B1
(45) Date of Patent: Jun. 22, 2021

(54) INTEGRATED MEMORY HAVING NON-OHMIC DEVICES AND CAPACITORS

(71) Applicant: Micron Technology, Inc., Boise, ID (US)

(72) Inventors: Pankaj Sharma, Boise, ID (US); Muralikrishnan Balakrishnan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/721,006

(22) Filed: Dec. 19, 2019

(51) Int. Cl.
| | |
|---|---|
| *G11C 13/00* | (2006.01) |
| *H01L 27/108* | (2006.01) |
| *H01L 45/00* | (2006.01) |
| *H01L 49/00* | (2006.01) |
| *H01L 29/786* | (2006.01) |
| *G11C 11/22* | (2006.01) |

(Continued)

(52) U.S. Cl.
CPC ...... *H01L 27/10814* (2013.01); *G11C 11/221* (2013.01); *H01L 27/11502* (2013.01); *H01L 29/78642* (2013.01); *H01L 29/78672* (2013.01); *H01L 45/06* (2013.01); *H01L 45/085* (2013.01); *H01L 45/1233* (2013.01); *H01L 45/141* (2013.01); *H01L 45/144* (2013.01); *H01L 45/146* (2013.01); *H01L 45/147* (2013.01); *H01L 49/003* (2013.01); *G11C 11/2257* (2013.01); *G11C 11/2259* (2013.01); *G11C 11/2273* (2013.01); *G11C 11/4085* (2013.01); *G11C 11/4091* (2013.01)

(58) Field of Classification Search
CPC ...................................................... G11C 11/22
USPC .......................................................... 365/145
See application file for complete search history.

(56) References Cited

U.S. PATENT DOCUMENTS

| | | | |
|---|---|---|---|
| 2002/0074584 A1* | 6/2002 | Yang ..................... | G11C 11/404 257/300 |
| 2005/0036392 A1* | 2/2005 | Goebel ............. | H01L 27/10891 365/232 |

(Continued)

OTHER PUBLICATIONS

Gopalakrishnan et al., "Highly-Scalable Novel Access Device Based on Mixed Ionic Electronic Conduction (MIEC) Materials for High Density Phase Change Memory (PCM) Arrays", IEEE Symposium on VLSI Technology, Jun. 2010, United States, pp. 205-206.

(Continued)

*Primary Examiner* — Min Huang
(74) *Attorney, Agent, or Firm* — Wells St. John P.S.

(57) ABSTRACT

Some embodiments include a memory cell having a non-ohmic device between a transistor source/drain region and a capacitor. Some embodiments include a memory cell having a transistor with a first source/drain region, a second source/drain region, and a channel region between the first and second source/drain regions. A capacitor is electrically coupled to the second source/drain region through a non-ohmic device. The non-ohmic device includes a non-ohmic-device-material which changes conductivity in response to an electrical property along the channel region. The non-ohmic-device-material has a high-resistivity-mode when the electrical property along the channel region is below a threshold level, and transitions to a low-resistivity-mode when the electrical property along the channel region meets or exceeds the threshold level. Some embodiments include a memory array.

49 Claims, 7 Drawing Sheets

(51) Int. Cl.
    *H01L 27/11502*   (2017.01)
    *G11C 11/4091*   (2006.01)
    *G11C 11/408*   (2006.01)

(56) References Cited

U.S. PATENT DOCUMENTS

| | | | | |
|---|---|---|---|---|
| 2010/0027318 | A1* | 2/2010 | Nagashima | G11C 13/0097 365/148 |
| 2010/0252802 | A1* | 10/2010 | Numata | B82Y 10/00 257/9 |
| 2010/0290271 | A1* | 11/2010 | Lung | G11C 11/4076 365/163 |
| 2013/0069141 | A1* | 3/2013 | Pan | G11C 16/0466 257/324 |
| 2016/0172420 | A1* | 6/2016 | Bajaj | H01L 45/06 365/148 |
| 2017/0179026 | A1* | 6/2017 | Toyama | H01L 27/11573 |
| 2017/0358742 | A1* | 12/2017 | Govoreanu | G11C 13/0069 |
| 2018/0122461 | A1* | 5/2018 | Song | G11C 7/10 |
| 2019/0164587 | A1* | 5/2019 | Machida | G11B 5/3909 |
| 2019/0221261 | A1* | 7/2019 | Ge | H01L 45/1608 |
| 2019/0221575 | A1* | 7/2019 | Dong | H01L 27/11582 |
| 2020/0328220 | A1 | 10/2020 | Derner et al. | |

OTHER PUBLICATIONS

Lim et al., "CMOS Compatible Low-Power Volatile Atomic Switch for Steep-Slope FET Devices", Applied Physics Letters vol. 113, 2018, United States, 5 pages.

Lim et al., "Excellent Threshold Switching Device (Ioff~1 pA) with Atom-Scale Metal Filament for Steep Slope (< 5 mV/dec), Ultra Low Voltage (Vdd = 0.25 V) FET Applications", IEEE IEDM Technical Digest, Dec. 2016, United States, p. 870-873.

Shukla et al., "A Steep-Slope Transistor Based on Abrupt Electronic Phase Transition", Nature Communications vol. 6, Aug. 2015, United Kingdom, 6 pages.

Song et al., "Steep Slope Field-Effect Transistors With Ag/TiO2-Based Threshold Switching Device", IEEE Electron Device Letters vol. 37, Issue 7, 2016, United States, pp. 932-934.

Virwani et al., "Sub-30nm Scaling and High-Speed Operation of Fully-Confined Access-Devices for 3D Crosspoint Memory Based on Mixed-Ionic-Electronic-Conduction (MIEC) Materials", IEEE IEDM Technical Digest, Dec. 2012, United States, 4 pages.

Shukla et al., "Fundamental Mechanism Behind Volatile and Non-Volatile Switching in Metallic Conducting Bridge RAM", IEEE IEDM Technical Digest, Dec. 2017, United States, 4 pages.

\* cited by examiner

INTEGRATED MEMORY HAVING NON-OHMIC DEVICES AND CAPACITORS

TECHNICAL FIELD

Integrated memory; such as, for example, ferroelectric random-access memory (FeRAM), dynamic random-access memory, etc.

BACKGROUND

A continuing goal is to achieve ever-increasing levels of integration of integrated memory. A related goal is to increase the packing density of memory components. It is also desired to develop integrated memory having strong signal, good durability over a large number of read/write cycles, fast access rates, protection against cell-to-cell disturb mechanisms, etc.

Memory may utilize memory cells (memory devices) which individually comprise an access transistor in combination with a capacitor. The capacitor may be a ferroelectric capacitor if the memory is ferroelectric random-access memory (FeRAM), or may be a non-ferroelectric capacitor if the memory is traditional dynamic random-access memory (DRAM).

It is desired to develop improved memory devices, and to develop improved memory arrays incorporating such devices.

Figure 1:
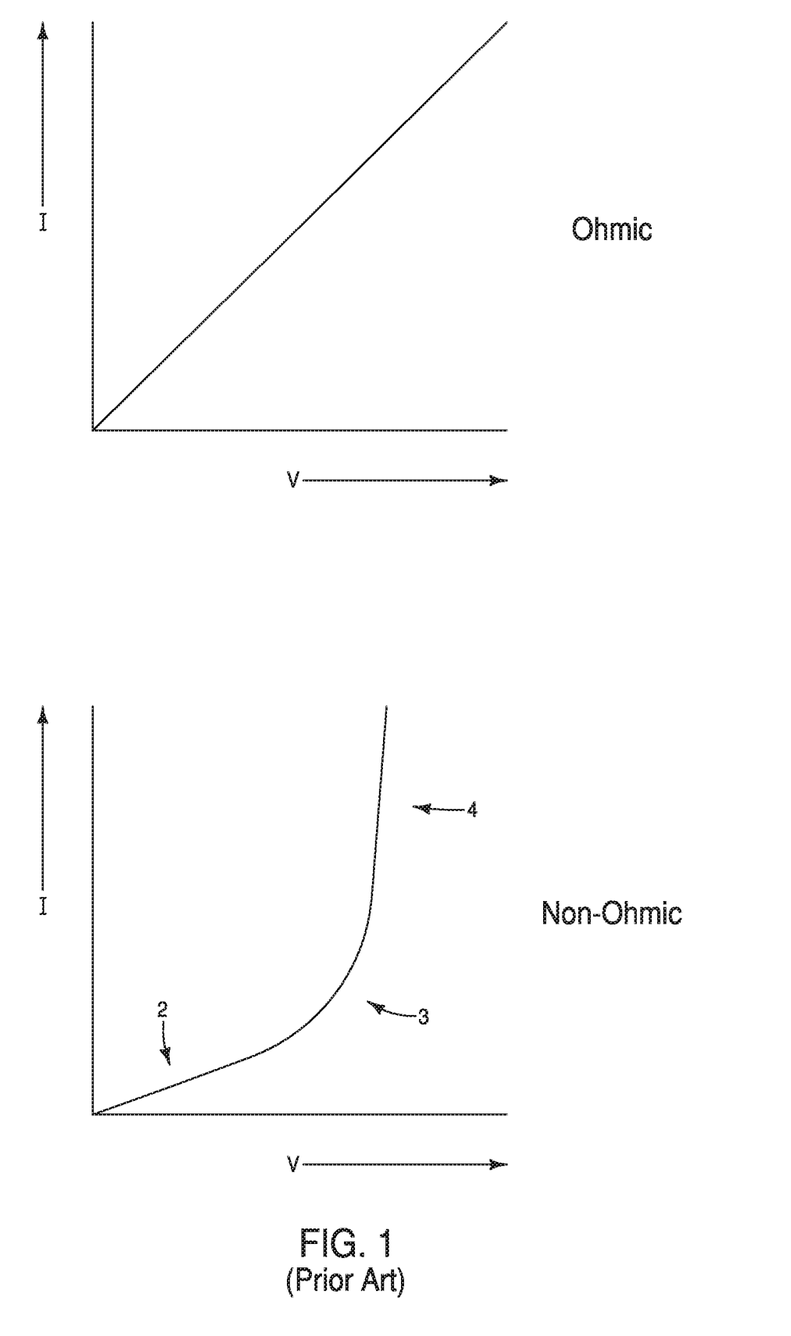
FIG. 1 graphically compares a prior art ohmic device with a prior art non-ohmic device.

The invention(s) described herein may utilize non-ohmic devices. FIG. 1 graphically compares a conventional ohmic device with a conventional non-ohmic device.

The upper graph shows current (I) versus voltage (V) for the ohmic device, and shows a linear relationship between the voltage and the current.

In contrast, the lower curve shows current (I) versus voltage (V) for the non-ohmic device, and shows a nonlinear relationship between the voltage and the current. Specifically, the lower curve shows that the non-ohmic device has a high-resistivity (low-conductivity) mode within a region 2 of the curve where the current increases slowly with increases in voltage, and has a low-resistivity (high-conductivity) mode within a region 4 of the curve where the current increases rapidly with increases in voltage. The high-resistivity mode transitions to the low-resistivity mode within a transition region 3.

In some applications, the non-ohmic device may be a device which changes from a high-resistivity mode to a low-resistivity mode upon exposure to increasing current and/or increasing voltage.

Figure 2A:
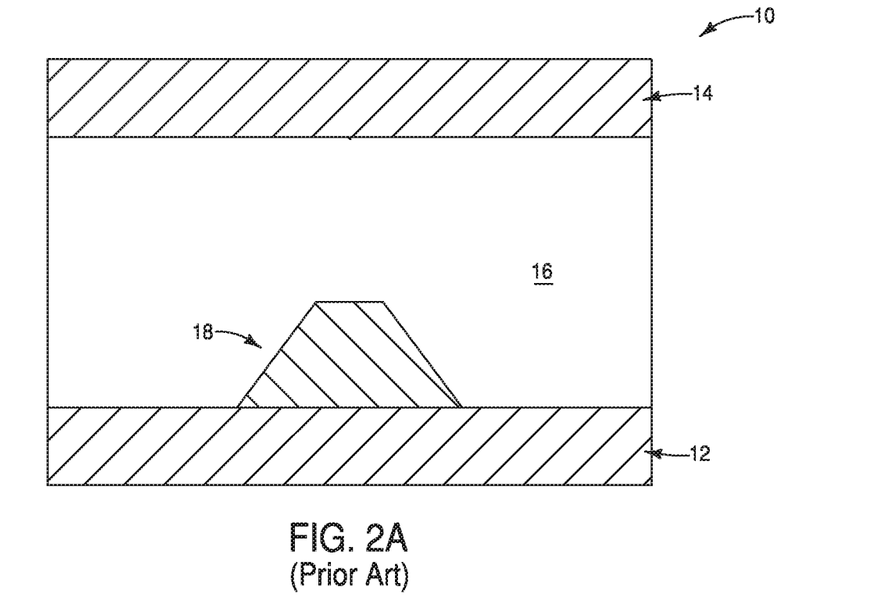
FIGS. 2A and 2B show an example prior art non-ohmic device in a high-resistivity mode (FIG. 2A), and a low-resistivity mode (FIG. 2B).

An example non-ohmic device 10 is described with reference to FIGS. 2A and 2B. The device 10 may be a conductive-bridging device. The device is shown in a high-resistivity mode in FIG. 2A, and in a low-resistivity mode in FIG. 2B.

The device 10 includes a first conductive electrode 12, a second conductive electrode 14, and an insulative material 16 between the electrodes 12 and 14. The insulative material may comprise one or more oxides having silver or copper dispersed therein.

Figure 2B:
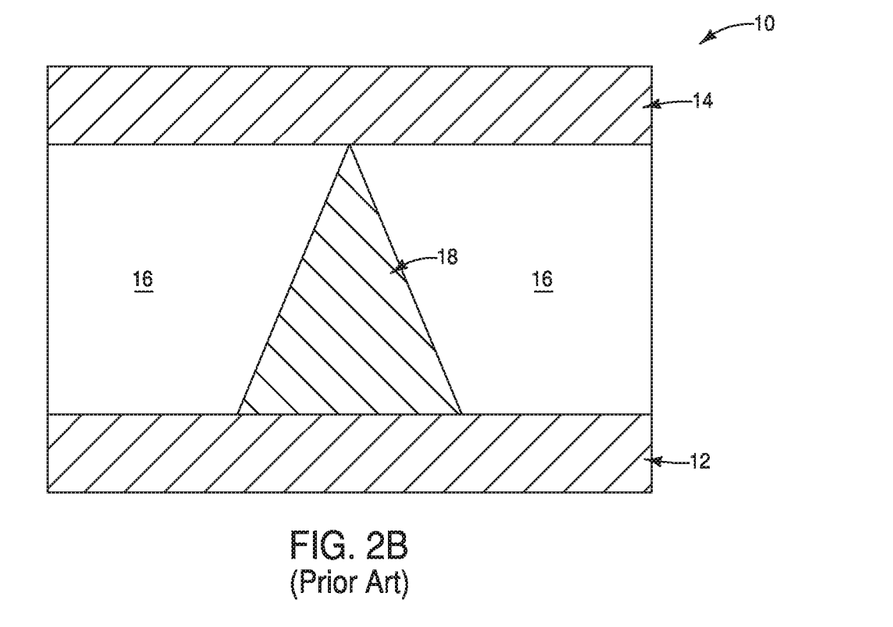

The low-resistance mode of FIG. 2B has a conductive filament 18 which extends through the insulative material 16 to electrically couple the first and second electrodes 12 and 14 with one another. In contrast, the high-resistance mode of FIG. 2A has only a portion of the filament 18 formed therein (or may have none of the filament formed therein), and accordingly does not have conductive coupling between the first and second electrodes 12 and 14.

In some applications, the filament 18 may grow across the insulative material 16 as a result of a voltage differential provided between the electrodes 12 and 14. Accordingly, the device 10 will remain in the high-resistivity mode (i.e. the mode 2 of the non-ohmic device of FIG. 1) until a threshold voltage is provided between the electrodes 12 and 14. The threshold voltage will induce formation of the filament 18, and thus lead to formation of the low-resistivity mode shown in FIG. 2B (i.e., the mode 4 of the non-ohmic device of FIG. 1).

Although the description above indicates that a voltage differential is utilized to form the filament 18, it is to be understood that the filament 18 may alternatively be described as being formed due to a threshold current being provided between the electrodes 12 and 14, and through the insulative material 16.

Another example non-ohmic device 10a is described with reference to FIGS. 3A and 3B. The device includes the first and second electrodes 12 and 14, and includes a phase-change-material 20 between the first and second electrodes. The phase-change-material may include one or more chalcogenides. The entirety of the phase-change-material 20 is within a first phase 21 in the configuration of FIG. 3A.

Figure 3A:
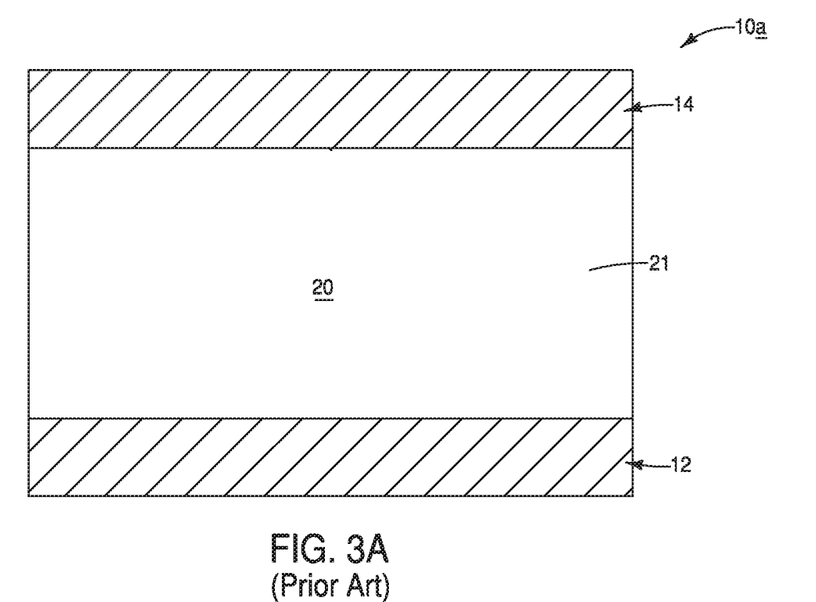
FIGS. 3A and 3B show another example prior art non-ohmic device in a high-resistivity mode (FIG. 3A), and a low-resistivity mode (FIG. 3B).
Figure 3B:
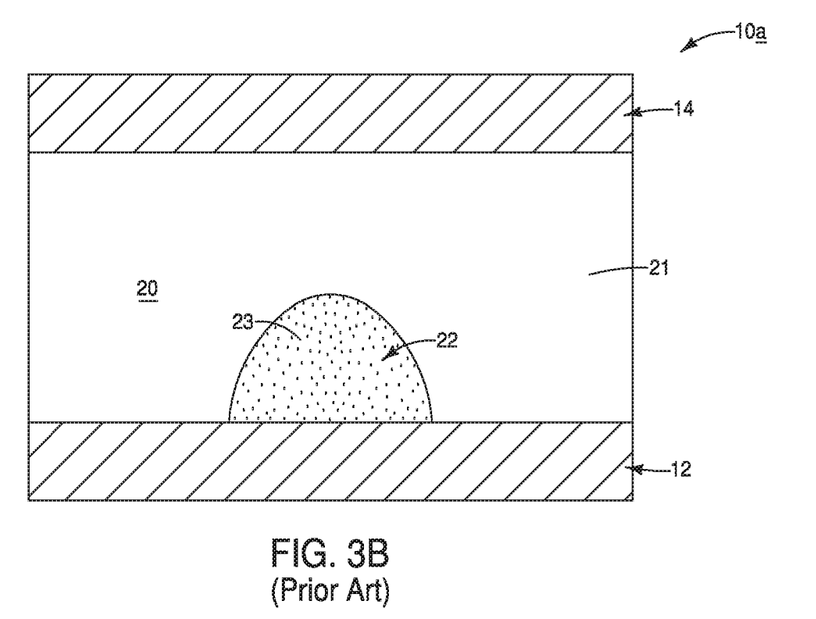

The device 10a is in a high-resistivity mode (analogous to the mode 2 of the non-ohmic device FIG. 1) in FIG. 3A, and is in a low-resistivity mode (analogous to the mode 4 of the non-ohmic device of FIG. 1) in FIG. 3B. The low-resistivity mode includes a region of the phase-change-material 20 which has transitioned into a region 22 having a second phase 23 (diagrammatically illustrated with hatching within the region 22). The second phase 23 is different than the first phase 21. The second phase 23 has higher conductivity (lower resistance) than the first phase 21.

In some applications, the material 20 may transition from the first phase 21 to the second phase 23 as result of threshold voltage (and/or threshold current) being provided across a region of the material 20 between the electrodes 12 and 14.

DETAILED DESCRIPTION OF THE ILLUSTRATED EMBODIMENTS

Conventional memory (e.g., FeRAM, DRAM) may include a capacitor coupled with a source/drain region of an access transistor (e.g., a ferroelectric capacitor for FeRAM and a non-ferroelectric capacitor for DRAM). The capacitor may be incorporated into a memory cell. The source/drain region be one of two source/drain regions of the access transistor, with the other of the source/drain regions being coupled with a digit line. A channel region extends between the two source/drain regions. A gate may be proximate the channel region, and may be utilized to control current flow along the channel region during operation of the access transistor. The source/drain regions may be electrically coupled to one another through the channel region during read/write operations associated with the memory cell, and otherwise are not electrically coupled to one another.

A problem with conventional memory is that current may leak from the capacitor through the channel region even in operational modes in which the source/drain regions are not to be electrically coupled with one another. Such leakage may problematically lead to loss of data.

The leakage may become more severe for access transistors with vertically-extending channel regions as opposed to those with horizontally-extending channel regions due to polycrystalline silicon commonly being utilized within the vertically-extending channel regions and monocrystalline silicon commonly being utilized within the horizontally-extending channel regions. The polycrystalline silicon may have grain boundaries and/or intergranular defects that influence device characteristics and lead to gate-induced drain leakage (GIDL) and/or other leakage mechanisms.

Some embodiments include memory having a capacitor (either a ferroelectric capacitor or a non-ferroelectric capacitor) coupled with a source/drain region of an access transistor through a non-ohmic device. The non-ohmic device may alleviate, or even preclude, the problematic leakage associated with conventional ferroelectric memory.

Figure 4:
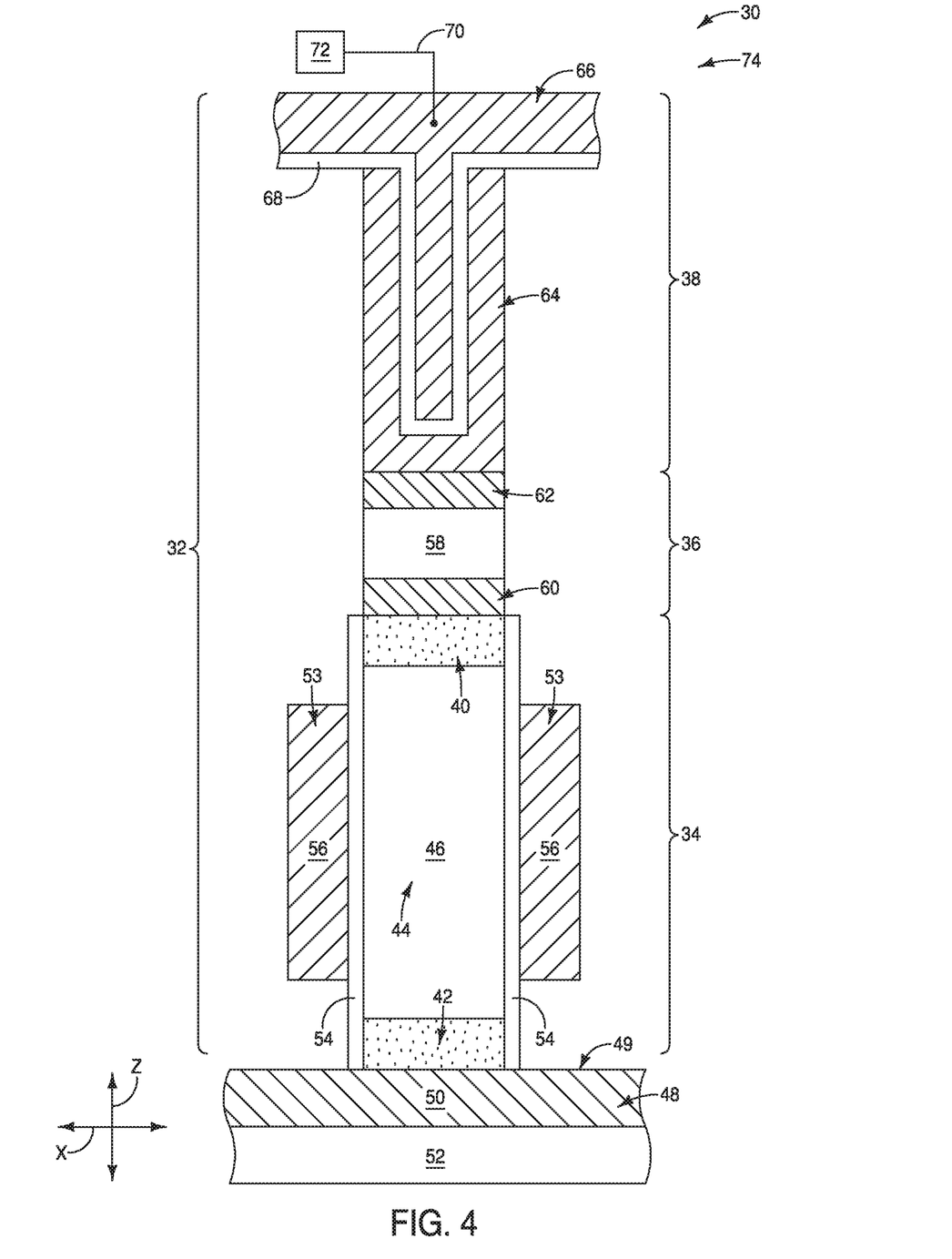
FIG. 4 is a diagrammatic cross-sectional side view of region of an example integrated assembly comprising an example memory cell.

FIG. 4 shows a portion of an integrated assembly 30 having an example memory device 32.

The device 32 includes an access transistor 34, a non-ohmic device 36, and a capacitor 38.

The access transistor 34 includes a pair of source/drain regions 40 and 42, and includes a channel region 44 extending between the source/drain regions 40 and 42. In the illustrated embodiment, the channel region extends vertically. The source/drain regions 40 and 42 may be referred to as an upper source/drain region and a lower source/drain region, respectively. In some embodiments, one of the source/drain regions 40 and 42 may be referred to as a first source/drain region while the other is referred to as a second source/drain region.

The regions 40, 42 and 44 are within a semiconductor material 46. The semiconductor material 46 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 46 may comprise, consist essentially of, or consist of silicon. The silicon may be in any suitable phase (e.g., one or more of polycrystalline, amorphous and monocrystalline). Stippling is utilized to differentiate the source/drain regions 40 and 42 from the channel region 44.

The source/drain regions 40 and 42 may comprise heavily-doped regions within the material 44. The heavy doping may correspond to doping of at least about $10^{22}$ atoms/cm$^3$ of one or more conductivity-enhancing dopants within the regions 40 and 42. The source/drain regions 40 and 42 may be n-type doped (e.g., may comprise one or both of phosphorus and arsenic). Alternatively, the source/drain regions 40 and 42 may be p-type doped (e.g., may comprise boron).

The channel region 44 may be doped to any suitable concentration with any suitable dopant. In some embodiments the channel region may be effectively undoped (i.e., may only comprise an intrinsic dopant concentration (e.g., a dopant concentration of less than or equal to about $10^{15}$ atoms/cm$^3$). In some embodiments, the configurations described herein may reduce an amount of dopant utilized in the channel region relative to increased/higher channel doping (higher threshold voltage doping) of conventional configurations; with the reduced amount of dopant being, for example, a dopant concentration within the channel region of less than or equal to about $10^{17}$ atoms/cm$^3$, less than or equal to about $10^{16}$ atoms/cm$^3$, or even less than equal to about $10^{15}$ atoms/cm$^3$.

The lower source/drain region 42 is electrically coupled with a digit line (bitline, sense line) 48, and in the shown embodiment is directly against an upper surface of the digit line 48.

The digit line 48 comprises conductive material 50. The conductive material 50 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit line 48 is supported by an insulative material 52. The insulative material 52 may comprise any suitable composition(s); and in some embodiments may comprise, consist essentially of, or consist of silicon dioxide.

The digit line 48 extends along an indicated x-axis direction, which is along the plane of the page of FIG. 4.

An upper surface 49 of the digit line 48 may be considered to extend along a horizontal direction corresponding to the illustrated x-axis direction. The channel region 44 extends along a vertical direction corresponding to the illustrated z-axis direction. In some embodiments, the vertical direction of the channel region 44 may be orthogonal to the horizontal direction of the upper surface 49 of the digit line 48 (as shown). Alternatively, the vertical direction of the channel region 44 may be substantially orthogonal to the horizontal direction of the upper surface 49, with the term "substantially orthogonal" meaning orthogonal to within reasonable tolerances of fabrication and measurement. In some embodiments, the vertical direction of the channel material 44 may be considered to be approximately orthogonal to the horizontal direction of the upper surface 49, with the term "approximately orthogonal" meaning within about 10° of orthogonal.

A gate 53 extends along the channel region 44, and is spaced from the channel region by an intervening dielectric material 54. The gate may be part of a wordline that extends in and out of the page relative to the cross-sectional view of FIG. 4, and accordingly crosses the digit line 48. The wordline may extend along a y-axis direction (not shown in FIG. 4) which is orthogonal to (or at least substantially orthogonal to) the x-axis direction of the digit line 48.

The gate 53 comprises conductive gate material 56. The conductive gate material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 54 may be referred to as gate dielectric material. The dielectric material 54 may comprise any suitable composition(s); and in some embodiments may comprise, consist essentially of, or consist of silicon dioxide.

In the illustrated embodiment, the gate 53 is along two sides of the channel material 44 along the cross-section of FIG. 4. In other embodiments, the gate may be along only one of the sides of the channel region 44. In yet other embodiments, the gate may extend entirely around the channel region (i.e., may extend along surfaces of the channel region which are in and out of the page relative to the cross-section of FIG. 4).

The gate 53 may be considered to be operatively adjacent to (operatively proximate to) the channel region 44 such that a sufficient voltage applied to the gate will induce an electric field which enables current flow through the associated channel region 44 to electrically couple the source/drain regions 40 and 42 with one another. If the voltage to the gate is below a threshold level, the current will not flow through the channel region, and the source/drain regions 40 and 42 will not be electrically coupled with one another. The selective control of the coupling/decoupling of the source/drain regions through the level of voltage applied to the gate may be referred to as gated coupling of the source/drain regions.

The non-ohmic device 36 is between the upper source/drain region 40 and the capacitor 38. The non-ohmic device 36 includes non-ohmic-device-material 58 between a lower electrode 60 and an upper electrode 62. In some embodiments, one of the electrodes 60 and 62 may be referred to as a first electrode and the other may be referred to as a second electrode.

The electrodes 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The electrodes 60 and 62 may comprise a same electrically conductive composition as one another, or may comprise different electrically conductive compositions relative to one another.

The non-ohmic-device-material 58 may comprise any suitable composition(s). For instance, the non-ohmic-device-material 58 may comprise conductive bridging material analogous to that described above with reference to FIGS. 2A and 2B, may comprise phase-change-material analogous to that described above with reference to FIGS. 3A and 3B, or may comprise any other suitable material which changes resistivity upon reaching a suitable threshold current and/or threshold voltage. In some embodiments, the non-ohmic-device-material 58 may comprise one or both of Ag (silver) and Cu (copper) dispersed within a matrix comprising, consisting essentially of, or consisting of one or more of HfO, TiO and CuS; where the chemical formulas indicate primary constituents rather than specific stoichiometries. The silver and/or copper may correspond to conductive-bridging materials; with the silver and/or copper ultimately forming conductive filaments within the matrices when threshold voltage and/or threshold current is provided across the matrices. In some embodiments, the device 36 comprising conductive-bridging material 58 may be referred to as a conductive-bridging device.

In some embodiments, the non-ohmic-device-material 58 may be an ovonic material, and specifically may comprise one or more chalcogenides. For instance, the material 58 may comprise one or more of germanium (Ge), antimony (Sb), tellurium (Te) and indium (In). In specific embodiments, the material 58 may, for example, comprise, consist essentially of, or consist of GeSbTe or InGeTe, where the formulas indicate the components within the listed substances, rather than designating specific stoichiometries of such components. The ovonic material may be referred to as phase change material, and the device 36 may be referred to as a phase change device. The phase change material may comprise one or more of germanium, antimony, tellurium and indium.

In some embodiments, the material 58 may comprise mixed ionic electronic conduction material; and may, for example, include one or more of SrTiO, TiO, CeO, LiFePO, and LaCuO; where the chemical formulas indicate primary constituents rather than specific stoichiometries. In such embodiments, the non-ohmic device 38 may be referred to as a mixed ion-electron conductor (MIEC).

In some embodiments, the material 58 may include metal insulator having a transition element. The transition element may correspond to one or both of vanadium (V) and niobium (Nb), and the metal insulator may correspond to one or both of VO and NbO; where the chemical formulas indicate primary constituents rather than specific stoichiometries.

In some embodiments, the non-ohmic device 36 may be an ovonic threshold switch. In such embodiments, the material 58 may include one or more chalcogenides.

In some embodiments, the non-ohmic device 36 may be referred to as a two-terminal select device, in that it comprises the two terminals 60 and 62.

The capacitor 38 includes a first electrode (bottom electrode) 64 which is electrically coupled with the non-ohmic device 36, a second electrode (top electrode) 66 and an insulative material 68 between the first and second electrodes 64 and 66. The capacitor may be a ferroelectric capacitor (i.e., may comprise ferroelectric insulative material) or may be a non-ferroelectric capacitor (i.e., may comprise non-ferroelectric insulative material).

The electrodes 64 and 66 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The electrodes 64 and 66 may comprise a same electrically conductive composition as one another, or may comprise different electrically conductive compositions relative to one another.

The insulative material 68 may comprise any suitable composition(s). The insulative material 68 may be a ferroelectric insulative material, and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric insulative material 68 may be provided in any suitable configuration; such as, for example, a single homogeneous composition, or a laminate of two or more discrete separate compositions. The insulative material 68 may be a non-ferroelectric insulative material, and may, for example, comprise, consist essentially of, or consist of one or more silicon dioxide, aluminum oxide, hafnium oxide, zirconium oxide, etc.

In the illustrated embodiment, the first electrode 64 is configured as an upwardly-opening container. The insulative material 68 and the second electrode 66 extend downwardly into such upwardly-opening container. In other embodiments, the capacitor 38 may have other configurations.

In some embodiments, one or both of the electrodes 60 and 62 of the non-ohmic device 36 may be omitted. For instance, the electrode 64 may be a common electrode for both the capacitor 38 and the non-ohmic device 36.

In some embodiments, the upper electrode 66 of the capacitor 38 may be referred to as a plate electrode. Such plate electrode may be coupled with a plate line (plate interconnect structure) 70 which extends to a reference voltage 72. The reference voltage may be at any suitable level; and in some embodiments may be ground, VCC/2, etc.

In operation, the non-ohmic-device-material 58 changes conductivity in response to a changing electrical property (e.g., voltage and/or current) along the channel region 44. The non-ohmic-device-material has a high-resistivity-mode (analogous to the mode 2 described above with reference to FIG. 1) when the electrical property along the channel region is below a threshold level, and transitions to a low-resistivity-mode (analogous to the mode 4 described above with reference to FIG. 1) when the electrical property along the channel region meets or exceeds the threshold level; with the electrical property and threshold level being understood to be referred to in an "absolute" mathematical sense so that the electrical property may have either a positive value (in which case the threshold level may be a higher positive value) or a negative value (in which case the threshold level may be a lower negative value). In some embodiments, the conductivity through the non-ohmic-device-material 58 in the low-resistivity-mode will be several orders of magnitude higher than the conductivity through the non-ohmic-device-material 58 in the high-resistivity-mode.

In some embodiments, the non-ohmic device 36 may be utilized solely to limit undesired leakage between the capacitor and the channel, and accordingly may not be a memory element (as compared to some conventional uses of non-ohmic devices as memory elements of memory cells).

Figure 5:
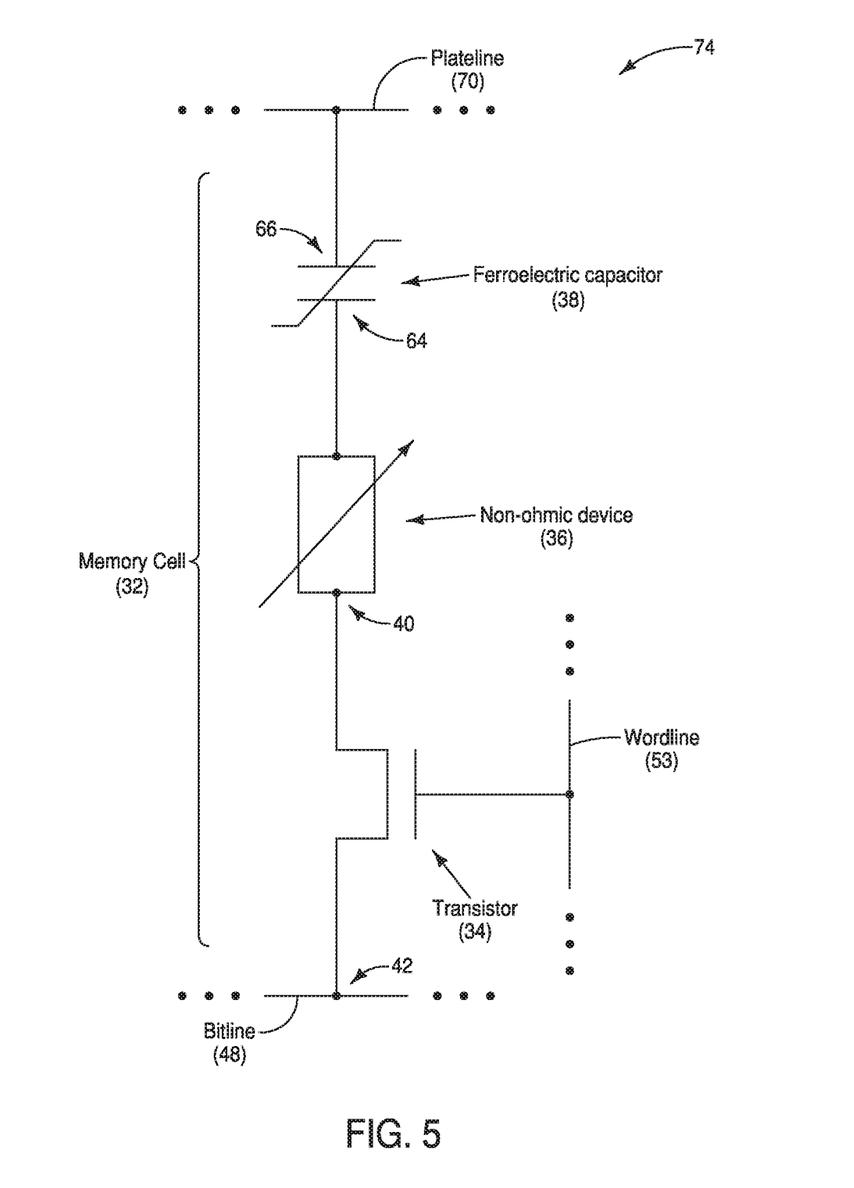
FIG. 5 is a diagrammatic schematic view of region of an example integrated assembly comprising an example memory cell.

The device 32 of FIG. 5 has one transistor and one capacitor, and may be referred to as a one-transistor-one capacitor (1T-1C) memory cell.

FIG. 5 shows a schematic illustration of the assembly 30 in an embodiment in which the capacitor 38 is a ferroelectric capacitor. The assembly includes the memory cell 32 which comprises the access transistor 34, the non-ohmic device 36 and the ferroelectric capacitor 38. The source/drain region 42 of the transistor 34 is coupled with the digit line (bitline) 48, and the source/drain region 40 of the transistor 34 is coupled with the non-ohmic device 36. The source/drain regions 40 and 42 are gatedly controlled (i.e., gatedly coupled to one another) through operation of the wordline 53. The electrode 64 of the ferroelectric capacitor 38 is coupled to the source/drain region 40 of the transistor 34 through the non-ohmic device 36. The electrode 66 of the ferroelectric capacitor 38 is coupled with the plate line 70.

Figure 6:
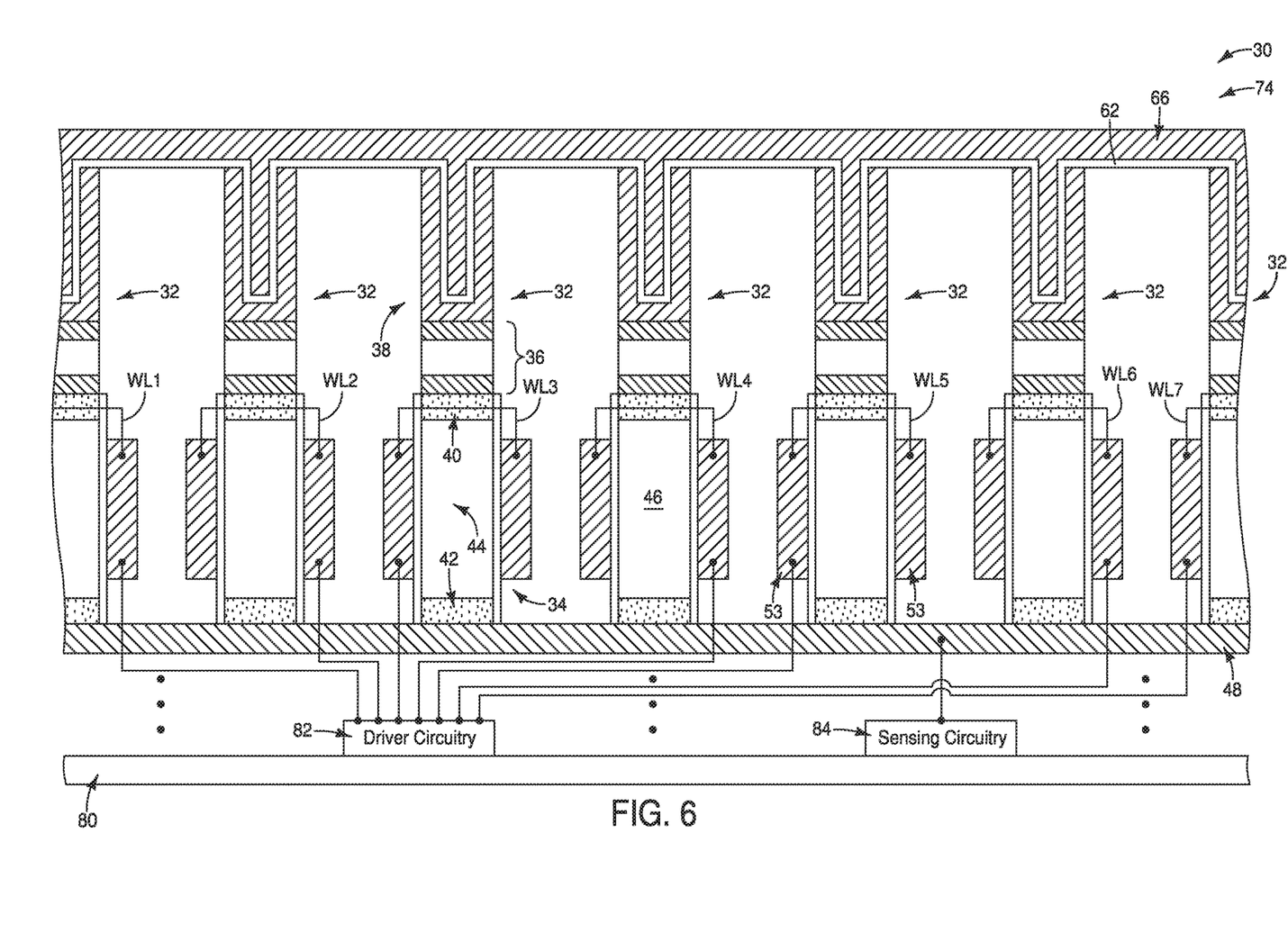
FIG. 6 is a diagrammatic cross-sectional side view of region of an example integrated assembly comprising a region of an example memory array.

The illustrated portions of the integrated assemblies of FIGS. 4 and 5 may be considered to be regions of a memory array 74. FIG. 6 shows a larger region of the memory array 74. The illustrated region of the memory array includes a plurality of the memory cells 32 over the digit line 48. Each of the memory cells includes a non-ohmic device 36 (only one of which is labeled) between a capacitor 38 (only one of which is labeled) and an access transistor 34 (only one of which is labeled). In the shown embodiment, the insulative material 62 extends across all of the illustrated capacitors 38, and the plate electrode 66 also extends across all of the illustrated capacitors 38. The insulative material 62 may be ferroelectric or non-ferroelectric, and accordingly, the capacitors 38 may be ferroelectric or non-ferroelectric.

Gates 53 (only one of which is labeled) along wordlines WL1-WL7, with such wordlines extending in and out of the page relative to the cross-section of FIG. 6.

The memory array 74 is supported by a base 80. The base 80 may comprise semiconductor material; and may, for example, comprise, consist essentially of, or consist of monocrystalline silicon. The base 80 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 80 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 80 and the memory array 74 to indicate that other components and/or devices may be provided between the base and the memory array. In the illustrated embodiment, logic circuitry is provided over the base 80 and under the memory array 74. The logic circuitry includes driver circuitry (e.g., wordline-driver-circuitry) 82 and sensing circuitry (e.g., sense-amplifier-circuitry) 84. The digit line 48 may be electrically coupled with the sensing circuitry 84, as shown. The wordlines 52 may be electrically coupled with the driver circuitry 82, as shown.

The base 80 and the memory array 74 may be part of a same semiconductor die, and may correspond to the levels provided over such die. Alternatively, the memory array 74 may be provided along a separate semiconductor die relative to the base 80.

Figure 7:
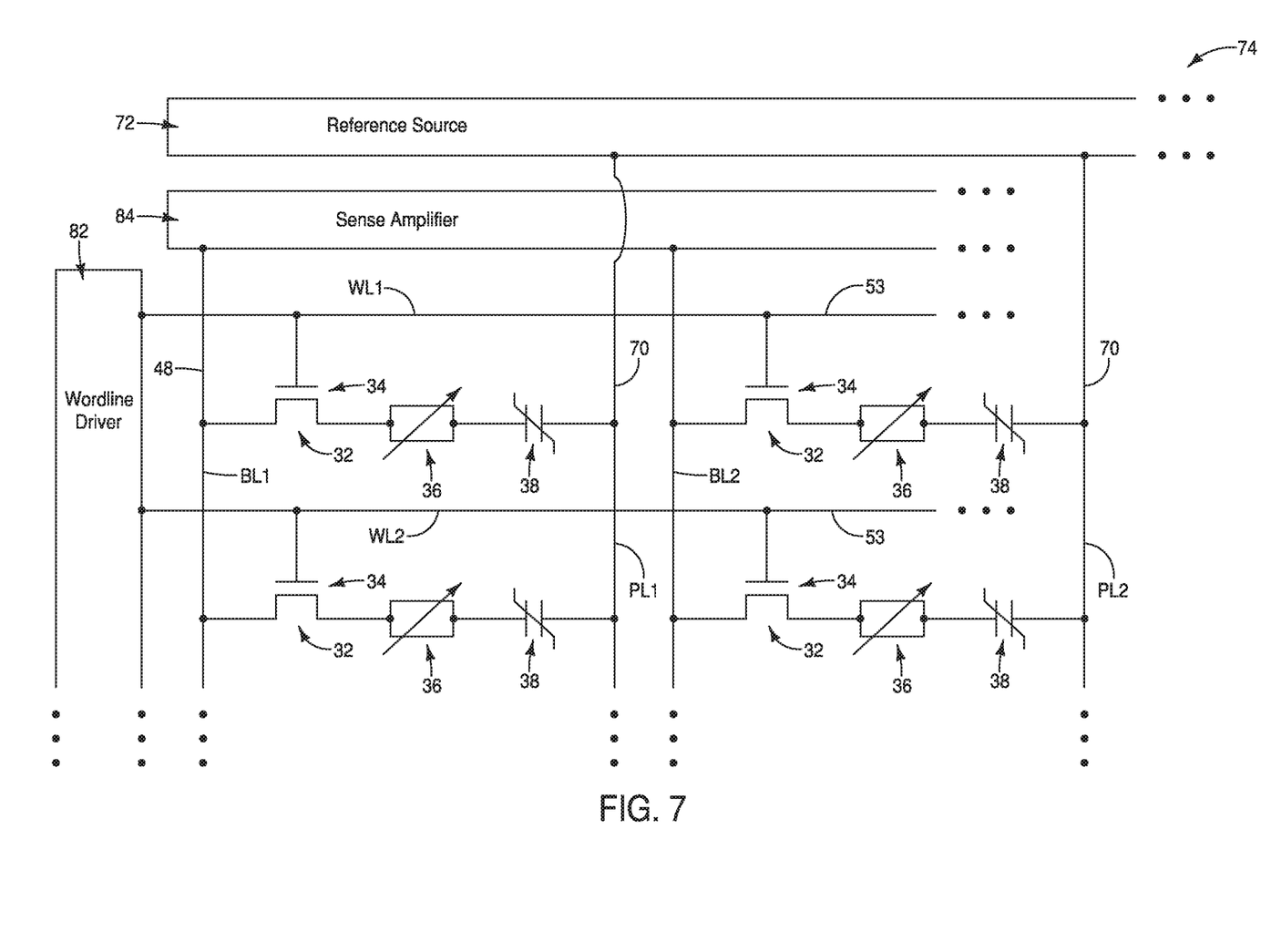
FIG. 7 is a diagrammatic schematic view of region of an example integrated assembly comprising a region of an example memory array.

FIG. 7 schematically illustrates a region of the memory array 74 of FIG. 6 in an embodiment in which the memory cells 32 comprise ferroelectric capacitors. The illustrated region comprises four of the memory cells 32; with each of the memory cells including a non-ohmic device 36 between a transistor 34 and a ferroelectric capacitor 38.

The illustrated region of the memory array 74 includes two of the wordlines (specifically, WL1 and WL2), two of the bitlines 48 (specifically, BL1 and BL2), and two of the plate lines 70 (specifically, PL1 and PL2). The wordlines are labeled 53 to indicate that such wordlines comprise the gates 53. In some embodiments, the wordlines may be considered to be extensions of the gates.

The wordlines are electrically coupled with a wordline driver 82, the bitlines 48 are coupled with a sense amplifier 84, and the plate lines 70 are electrically coupled with a reference source 72. Each of the memory cells 32 is uniquely addressed by a combination which includes one of the wordlines (gate lines) and one of the digit lines (bitlines). In analogous embodiments, the capacitors may be non-ferroelectric capacitors of a DRAM array, and each of the capacitors by be uniquely addressed by a wordline (gate line) and a digit line (bitline).

In some embodiments, the memory cell configurations described herein can eliminate any need to operate a memory cell (e.g., a DRAM cell) under conditions in which negative voltage is applied to a gate of an access transistor (e.g., the access transistor 34).

In some embodiments, the memory cell configurations described herein can eliminate any need to for leaker devices extending from the storage nodes of ferroelectric capacitors to the plate electrodes of the ferroelectric capacitors (with such leaker devices being utilized to loosely electrically couple the plate electrodes with the storage nodes to allow excess charge to dissipate from the storage nodes), in contrast to some conventional configurations.

In some embodiments, the response characteristics triggered in the non-ohmic device may reduce the voltage utilized along the gate of the access transistor, may be reduce overstress of gate dielectric (e.g., gate oxide), and improve device reliability.

In some embodiments, threshold voltage of the channel region (44), operational characteristics of the non-ohmic device (36), operational characteristics of the capacitor (38), voltage on the gate (53) and/or voltage on the digit line (48) may be tailored to avoid "pumping the node", particularly in DRAM embodiments.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell having a non-ohmic device between a transistor source/drain region and a capacitor.

Some embodiments include a memory cell having a transistor with a first source/drain region, a second source/drain region, and a channel region between the first and second source/drain regions. A capacitor is electrically coupled to the second source/drain region through a non-ohmic device. The non-ohmic device includes a non-ohmic-device-material which changes conductivity in response to an electrical property along the channel region. The non-ohmic-device-material has a high-resistivity-mode when the electrical property along the channel region is below a threshold level, and transitions to a low-resistivity-mode when the electrical property along the channel region meets or exceeds the threshold level.

Some embodiments include a memory array having digit lines extending along a first direction. Access transistors include first source/drain regions electrically coupled with the digit lines, second source/drain regions vertically offset from the first source/drain regions, and channel regions between the first and second source/drain regions. Gates are operatively proximate the channel regions. Capacitors are electrically coupled with the second source/drain regions through non-ohmic devices. The capacitors are comprised by memory cells. Each of the memory cells is uniquely addressed by one of the digit lines in combination with one of the wordlines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising a non-ohmic device between a transistor first source/drain region and a capacitor, the non-ohmic device being a non-memory element in operation, the transistor having a channel region extending vertically between the first source/drain region and a second source/drain region.

2. The memory cell of claim 1 being a one-transistor-one-capacitor memory cell.

3. The memory cell of claim 1 wherein the capacitor is a ferroelectric capacitor.

4. The memory cell of claim 3 wherein the ferroelectric capacitor has a plate electrode and a storage node, and does not have a leaker device extending from the storage node to the plate electrode.

5. The memory cell of claim 1 wherein the capacitor is a non-ferroelectric capacitor.

6. The memory cell of claim 1 wherein the transistor comprises a gate, and wherein negative voltage is not applied to said gate.

7. The memory cell of claim 1 wherein the non-ohmic device includes one or more of Ag, Cu, HfO, TiO and CuS; where the chemical formulas indicate primary constituents rather than specific stoichiometries.

8. The memory cell of claim 1 wherein the non-ohmic device includes chalcogenide.

9. The memory cell of claim 1 wherein the non-ohmic device is a two-terminal select device.

10. The memory cell of claim 1 wherein the non-ohmic device is a mixed ion-electron conductor.

11. The memory cell of claim 1 wherein the non-ohmic device is an ovonic threshold switch.

12. The memory cell of claim 1 wherein the non-ohmic device is a conductive-bridging device.

13. The memory cell of claim 1 wherein the non-ohmic device is a phase change device.

14. The memory cell of claim 13 wherein the phase change device includes phase change material comprising one or more of germanium, antimony, tellurium and indium.

15. The memory cell of claim 1 wherein the non-ohmic device includes mixed ionic electronic conduction material.

16. The memory cell of claim 15 wherein the mixed ionic electronic conduction material includes one or more of SrTiO, TiO, CeO, LiFePO, and LaCuO; where the chemical formulas indicate primary constituents rather than specific stoichiometries.

17. The memory cell of claim 1 wherein the non-ohmic device includes a metal insulator having a transition element.

18. The memory cell of claim 17 wherein the transition element is vanadium.

19. The memory cell of claim 18 wherein the metal insulator is VO, where the chemical formula indicates primary constituents rather than a specific stoichiometry.

20. The memory cell of claim 17 wherein the transition element is niobium.

21. The memory cell of claim 20 wherein the metal insulator is NbO, where the chemical formula indicates primary constituents rather than a specific stoichiometry.

22. The memory cell of claim 1 wherein:
the second source/drain region is electrically coupled with a digit line.

23. The memory cell of claim 22 wherein:
the capacitor includes a first electrode which is electrically coupled with the non-ohmic device, a second electrode offset from the first electrode, and an insulative material between the first and second electrodes;
the first electrode is configured as an upwardly-opening container; and
the insulative material and the second electrode extend into the upwardly-opening container.

24. A memory cell comprising a non-ohmic device between an access transistor having a vertically-extending channel region and a capacitor, the non-ohmic device operating as a non-memory element.

25. The memory cell of claim 24 wherein the channel region comprises polycrystalline silicon.

26. The memory cell of claim 24 wherein the capacitor is a ferroelectric capacitor.

27. The memory cell of claim 24 wherein the capacitor is a non-ferroelectric capacitor.

28. A memory cell comprising:
a transistor having a first source/drain region, a second source/drain region, and a channel region extending vertically between the first and second source/drain regions; and
a capacitor electrically coupled to the second source/drain region through a non-ohmic device that is a non-memory element in operation; the non-ohmic device including a non-ohmic-device-material which changes conductivity in response to an electrical property along the channel region; the non-ohmic-device-material having a high-resistivity-mode when the electrical property along the channel region is below a threshold level, and transitioning to a low-resistivity-mode when the electrical property along the channel region meets or exceeds the threshold level.

29. The memory cell of claim 28 wherein a dopant concentration within the channel region is less than or equal to about $10^{17}$ atoms/cm$^3$.

30. The memory cell of claim 28 wherein the capacitor is a ferroelectric capacitor.

31. The memory cell of claim 28 wherein the capacitor is a non-ferroelectric capacitor.

32. The memory cell of claim 28 wherein the electrical property is current.

33. The memory cell of claim 28 wherein the electrical property is voltage.

34. The memory cell of claim 28 wherein the first source/drain region is electrically coupled with a digit line.

35. The memory cell of claim 28 wherein the non-ohmic-device-material includes one or more of Ag, Cu, HfO, TiO and CuS; where the chemical formulas indicate primary constituents rather than specific stoichiometries.

36. The memory cell of claim 28 wherein the non-ohmic-device-material includes one or more of germanium, antimony, tellurium and indium.

37. The memory cell of claim 28 wherein the non-ohmic-device-material includes mixed ionic electronic conduction materials.

38. The memory cell of claim 28 wherein the non-ohmic-device-material includes one or both of VO and NbO, where the chemical formulas indicate primary constituents rather than specific stoichiometries.

39. A memory array, comprising:
digit lines extending along a first direction;
access transistors having first source/drain regions electrically coupled with the digit lines, second source/drain regions vertically offset from the first source/drain regions, and channel regions between the first and second source/drain regions;
gate lines operatively proximate the channel regions and extending along a second direction that crosses the first direction; and
capacitors electrically coupled with the second source/drain regions through non-ohmic devices that are non-memory elements; the capacitors being comprised by memory cells; each of the memory cells being uniquely addressed by one of the digit lines in combination with one of the wordlines.

40. The memory array of claim 39 wherein the capacitors are ferroelectric capacitors.

41. The memory array of claim 39 wherein the capacitors are non-ferroelectric capacitors.

42. The memory array of claim 39 wherein:
the memory cells of the memory array are arranged in columns and rows, with the digit lines extending along the columns and the gate lines extending along the rows;
the memory cells are over a base; and
logic circuitry is along the base and directly under the memory cells.

43. The memory array of claim 42 wherein:
the logic circuitry includes sensing circuitry and driver circuitry;
the digit lines are electrically coupled with the sensing circuitry; and
the gate lines are electrically coupled with the driver circuitry.

44. The memory array of claim 39 wherein the non-ohmic devices including non-ohmic-device-material which changes conductivity in response to voltage along an associated one of the channel regions; the non-ohmic-device-material having a high-resistivity-mode when the voltage along the associated one of the channel regions is below a threshold level, and transitioning to a low-resistivity-mode when the voltage along the associated one of the channel regions meets or exceeds the threshold level.

45. The memory array of claim 39 wherein the non-ohmic devices including non-ohmic-device-material which changes conductivity in response to current along an associated one of the channel regions; the non-ohmic-device-material having a high-resistivity-mode when the current along the associated one of the channel regions is below a threshold level, and transitioning to a low-resistivity-mode when the current along the associated one of the channel regions meets or exceeds the threshold level.

46. The memory array of claim 39 wherein:
the non-ohmic devices including non-ohmic-device-material; and
the non-ohmic-device-material includes one or more of Ag, Cu, HfO, TiO and CuS; where the chemical formulas indicate primary constituents rather than specific stoichiometries.

47. The memory array of claim 39 wherein the non-ohmic devices including non-ohmic-device-material, and wherein the non-ohmic-device-material includes one or more of germanium, antimony, tellurium and indium.

48. The memory array of claim 39 wherein the non-ohmic devices including non-ohmic-device-material, and wherein the non-ohmic-device-material includes mixed ionic electronic conduction materials.

49. The memory array of claim 39 wherein the non-ohmic devices including non-ohmic-device-material, and wherein the non-ohmic-device-material includes one or both of VO and NbO, where the chemical formulas indicate primary constituents rather than specific stoichiometries.

* * * * *